United States Patent
Hong et al.

(10) Patent No.: US 8,397,122 B2
(45) Date of Patent: Mar. 12, 2013

(54) METHOD AND APPARATUS FOR UNEQUAL ERROR PROTECTION OF VIDEO SIGNAL OVER WIDEBAND HIGH FREQUENCY WIRELESS SYSTEM

(75) Inventors: Seung Eun Hong, Daejeon (KR); Yong Sun Kim, Suwon-si (KR); Kyeongpyo Kim, Daejeon (KR); Hyoung Jin Kwon, Chungcheongbuk-do (KR); Jin Kyeong Kim, Daejeon (KR); Woo Yong Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 1013 days.

(21) Appl. No.: 12/407,493

(22) Filed: Mar. 19, 2009

(65) Prior Publication Data

US 2009/0241007 A1    Sep. 24, 2009

(30) Foreign Application Priority Data

Mar. 19, 2008  (KR) .................. 10-2008-0025474
May 6, 2008    (KR) .................. 10-2008-0041978
Mar. 18, 2009  (KR) .................. 10-2009-0023222

(51) Int. Cl.
*H03M 13/00* (2006.01)
(52) U.S. Cl. ........................... 714/752; 714/776
(58) Field of Classification Search ............. 714/701, 714/746, 755, 776, 752; 375/240.27
See application file for complete search history.

(56) References Cited

U.S. PATENT DOCUMENTS

| | | | |
|---|---|---|---|
| 2007/0271493 A1* | 11/2007 | Oh et al. | 714/755 |
| 2007/0286196 A1* | 12/2007 | Fan et al. | 370/392 |
| 2009/0052578 A1* | 2/2009 | Sawai | 375/299 |
| 2009/0238286 A1* | 9/2009 | Kim et al. | 375/240.27 |
| 2010/0223526 A1* | 9/2010 | Hong et al. | 714/755 |

FOREIGN PATENT DOCUMENTS

| | | |
|---|---|---|
| JP | 8-112901 | 5/1996 |
| JP | 2000-196562 | 7/2000 |
| JP | 2003-163580 | 6/2003 |
| JP | 2004-194143 | 7/2004 |
| JP | 2008-39844 | 2/2008 |
| KR | 10-2007-0113679 | 11/2007 |

* cited by examiner

*Primary Examiner* — Phung M Chung
(74) *Attorney, Agent, or Firm* — Staas & Halsey LLP

(57) ABSTRACT

Disclosed are an Unequal Error Protection (UEP) method and apparatus of video signals based on a dynamic link in a broadband high frequency wireless system.

A UEP transmission apparatus based on a dynamic link includes a UEP transmission controller to verify, based on a channel state when video data is inputted, a bit field size and a bit separation point of separating a priority for each pixel element being comprised of a pixel of the video data, and to control an error correction coding for correcting relatively many errors occurring in information with a high priority for each pixel element to be used, a bit separator unit to separate the video data pixel based on the priority for each pixel element, and a channel coding unit to perform a corresponding error correction coding through the control of the UEP transmission controller based on the priority for each pixel element.

17 Claims, 11 Drawing Sheets

| 124n | 124a | 123 | 150 | 140 | 130 | 122 | 121 |
|---|---|---|---|---|---|---|---|
| Octets: 1 | 1 | 1 | 3 | 1 | 1 | 2 | 2 |
| MCS request/response-n | MCS request/response-n | UEP Type | Bit separation point | Color depth | Color format | Length | Command type |
| ... | ... | | | | | | |

Color format:

| Hex Value | Color format |
|---|---|
| 0x00 | RGB |
| 0x01 | YCbCr |
| 0x02 | Reserved |

Color depth:

| Hex Value | Color depth(X:Y:Z) |
|---|---|
| 0x00 | 4:2:2 |
| 0x01 | 4:4:4 |
| 0x02 | 5:6:5 |
| 0x03 | 8:8:8 |
| 0x04 | 16:16:16 |
| 0x05 | 24:24:24 |
| 0x06-FF | Reserved |

Bit separation point:

| Hex Value | Separation Point for X | Hex Value | Separation Point for Y | Hex Value | Separation Point for Y |
|---|---|---|---|---|---|
| | 0: All bits are MSB | | 0: All bits are MSB | | 0: All bits are MSB |
| $b_7$–$b_0$: | $0 < n < X$: $(b_0$–$b_{n-1})$=LSB $(b_0$–$b_{X-1})$=MSB | $b_{15}$–$b_8$: | $0 < n < Y$: $(b_0$–$b_{n-1})$=LSB $(b_0$–$b_{Y-1})$=MSB | $b_{23}$–$b_{16}$: | $0 < n < Z$: $(b_0$–$b_{n-1})$=LSB $(b_0$–$b_{Z-1})$=MSB |
| 0x00 ~ 0xFF | X: All bits are LSB | 0x00 ~ 0xFF | Y: All bits are LSB | 0x00 ~ 0xFF | Z: All bits are LSB |
| | X+1~255: Reserved | | Y+1~255: Reserved | | Z+1~255: Reserved |

METHOD AND APPARATUS FOR UNEQUAL ERROR PROTECTION OF VIDEO SIGNAL OVER WIDEBAND HIGH FREQUENCY WIRELESS SYSTEM

CROSS-REFERENCE TO RELATED APPLICATIONS

This application claims the benefit of Korean Patent Application Nos. 10-2008-0025474, filed on Mar. 19, 2008, 10-2008-0041978, filed on May 6, 2008, and 10-2009-0023222, filed on Mar. 18, 2009, in the Korean Intellectual Property Office, the disclosures of which are incorporated herein by reference.

BACKGROUND

1. Field

Example embodiments of the present disclosure relate to video signal transmission and reception in a system where a high speed transmission is possible through an ultra wideband frequency band even in a wireless communication system, and more particularly, to an Unequal Error Protection (UEP) apparatus and method for transmitting and receiving various types of video signals, which are immune to radio channel errors, according to a priority of the video signals while maintaining a high transmission/reception speed.

2. Description of the Related Art

Unlike general data information in which priorities of all data information bits are the same, video information may have different priorities of video information bits. For example, upper bits of pixel bytes displaying images may be more important than lower bits thereof, and luminance information bits of an image may be more important than chrominance information bits of the image. Also, in an RGB chromatic system being comprised of Red elements, Green elements, and Blue elements, the Green elements are more important.

In general, the video information may be required to be transmitted at a high speed because an amount of the video information is significantly greater than that of the general data information and the video information requires real-time performance in information transmission. In addition, channel errors may occur in a radio channel due to various factors, resulting in transformation of transmitted information. To minimize the transformation of the information due to the radio channel errors, supplementary information (hereinafter, referred to as channel error correction code) may be added to information intended to be transmitted in a transmission terminal, and transformed information may be restored in a reception terminal using the added channel error correction code. However, the channel error correction code information may reduce a transmission speed of a channel.

Concerning the priority of the video information and characteristics of the radio channel, a recent 'high transmission speed radio system through an ultra-wideband high frequency band' may categorize upper bits and lower bits of pixel information bytes being comprised of image information, and use more channel error correction code information in the upper bits and use less channel error correction code information in the lower bits, thereby preventing transformation of important information, and improving image quality. As described above, adapting unequal error correction schemes according to a priority of signals may be referred to as an Unequal Error Protection (UEP) scheme.

However, in a conventional UEP method, significant bits are separated based on a fixed bit location.

SUMMARY

One or more example embodiments may provide an Unequal Error Protection (UEP) method and apparatus of video signals based on a dynamic link in an ultra broadband high frequency wireless system.

One or more example embodiments may also provide a UEP method and apparatus for transmitting/receiving various types of video signals, which are immune to radio channel errors, according to a priority of the video signals while maintaining a high transmission/reception speed.

According to example embodiments, a UEP method based on a dynamic link in a transmission apparatus may be provided. The UEP method may include: verifying, based on a channel state when video data is inputted, a bit separation point for separating a bit field size and a priority for each pixel element being comprised of a pixel of the video data; separating the pixel of the video data based on the priority for each pixel element; and performing an error correction coding for correcting relatively many errors occurring in information with a high priority for each pixel element.

According to other example embodiments, a UEP method based on a dynamic link in a reception apparatus may be provided. The UEP method may include: transmitting channel state changed information according to a channel state, and verifying a bit separation point for separating a bit field size and a priority for each pixel element being comprised of a pixel of video data; demodulating UEP video data according to priority information of UEP video data included in a header of the UEP video data, when receiving the UEP video data; correcting data in accordance with an error correction coding obtained by separating the demodulated data according to the priority information; and combining the corrected data for each pixel element based on the bit field size and the bit separation point.

According to still other example embodiments, a UEP transmission apparatus based on a dynamic link may be provided. The UEP transmission apparatus may include: a UEP transmission controller to verify, based on a channel state when video data is inputted, a bit field size and a bit separation point of separating a priority for each pixel element being comprised of a pixel of the video data, and to control an error correction coding for correcting relatively many errors occurring in information with a high priority for each pixel element to be used; a bit separator unit to separate the video data pixel based on the priority for each pixel element; and a channel coding unit to perform a corresponding error correction coding through the control of the UEP transmission controller based on the priority for each pixel element.

Additional aspects and/or advantages will be set forth in part in the description which follows and, in part, will be apparent from the description, or may be learned by practice of the example embodiments.

BRIEF DESCRIPTION OF THE DRAWINGS

These and/or other aspects, features, and advantages of example embodiments will become apparent and more readily appreciated from the following description, taken in conjunction with the accompanying drawings of which.

DETAILED DESCRIPTION

Reference will now be made in detail to example embodiments, examples of which are illustrated in the accompanying drawings, wherein like reference numerals refer to the like elements throughout. Example embodiments are described below to explain the present disclosure by referring to the figures.

Example embodiments of the present disclosure relates to an Unequal Error Protection (UEP) apparatus and method of video signals in an ultra broadband high frequency wireless system, and a configuration of a UEP transmission apparatus will be hereinafter described in detail with reference to FIG. 1.

In general, a Most Significant Bit (MSB) may designate a bit of most significantly affecting bit-unit operations, a Least Significant Bit (LSB) may designate a bit of most insignificantly affecting the bit-unit operations. However, according to example embodiments in a more expanded manner, the MSB may designate upper bits having a high significance and the LSB may designate lower bits having a low significance when dividing a pixel of video data into bits with the high significance and bits with the low significance.

Figure 1:
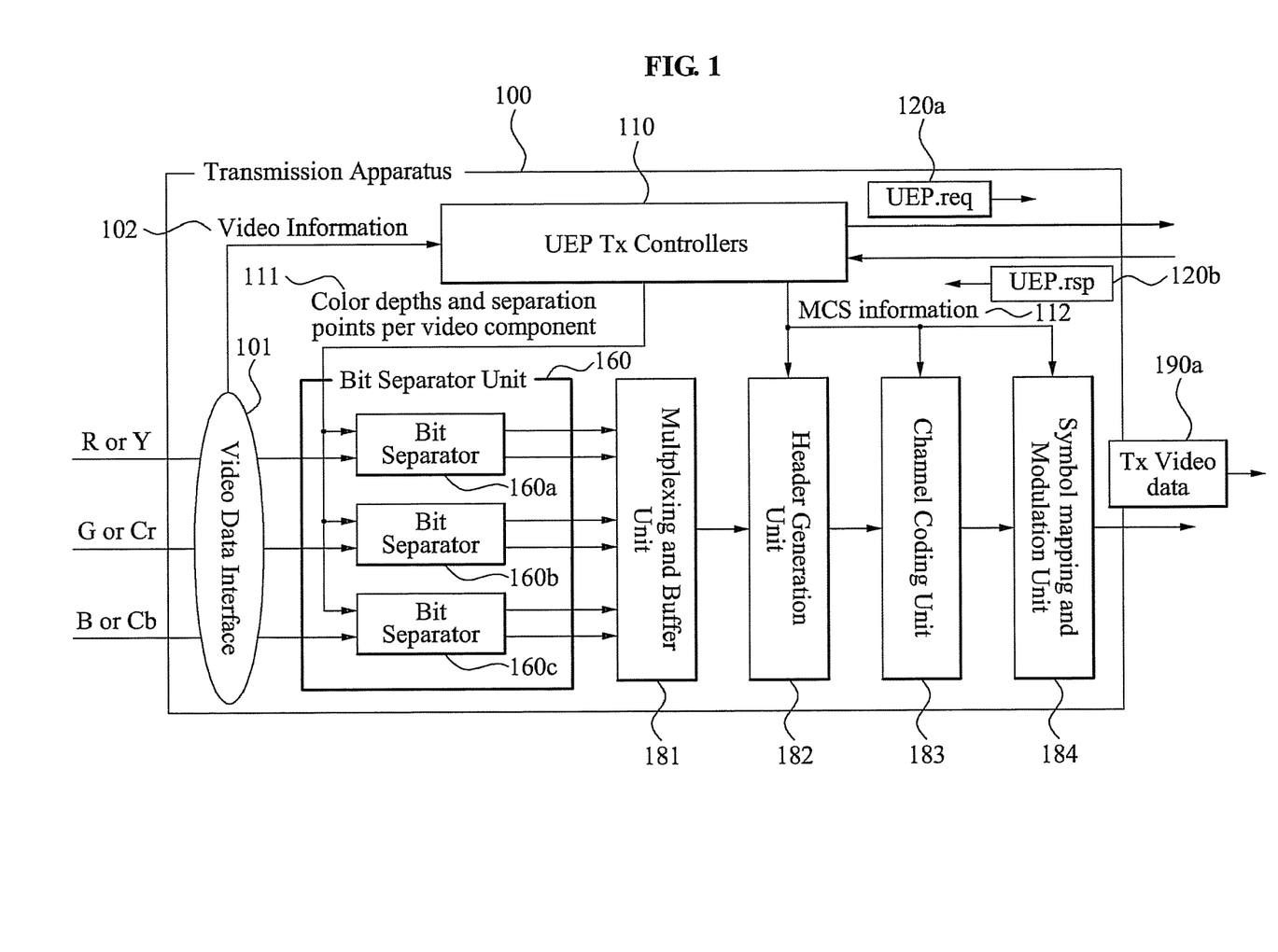
FIG. 1 illustrates a configuration of an Unequal Error Protection (UEP) transmission apparatus based on a dynamic link according to example embodiments.

FIG. 1 illustrates a configuration of a UEP transmission apparatus 100 based on a dynamic link according to example embodiments. The UEP transmission apparatus 100 may verify, based on a channel state when video data is inputted, a bit separation point for separating a bit field size and a priority for each pixel element being comprised of a pixel of the video data. The UEP transmission apparatus 100 may include a UEP transmission controller 110 (hereinafter, referred to as UEP Tx controller) to control an error correction coding for correcting relatively many errors occurring in information with a high priority for each pixel element to be used, a bit separator unit 160 to separate the video data pixel based on the priority for each pixel element through the control of the UEP Tx controller 110, and a channel coding unit 183 to perform a corresponding error correction coding based on the priority for each pixel element through the control of the UEP Tx controller 110 based on the priority for each pixel element. The UEP transmission apparatus 100 may further include a video data input interface 101 to receive various video signals such as R/G/B, Y/Cb/Cr, and the like, a multiplexing and buffer unit 181 to multiplex and store configured frames, a header generation unit 182 to assign sequencing and priority information, and record demodulation and channel decoding information, and a symbol mapping and modulation unit 184 to perform symbol mapping and modulation depending on the priority.

The video data input interface 101 may be an apparatus receiving various types of uncompressed video signals, so while the present specification may describe only R/G/B and Y/Cb/Cr types, other uncompressed video signals may be received.

R/G/B color image may be comprised of pixels constituting Red (R), Green (G), and Blue (B) elements, and Y/Cb/Cr color image may be comprised of pixels constituting a luminance (Y) element and chrominance elements (Cb and Cr).

These pixel elements may be displayed as various color depths such as 8-bits, 16-bits, and the like. The video data input interface 101 may inform the UEP Tx controller 110 of inputted uncompressed video information 102, and transmit, to the video signal bit separator 160, the inputted uncompressed video information 102 for each pixel information.

The UEP Tx controller 110 may receive, from the video data input interface 101, the video information 102 including a pixel type constituting video images, a bit field size of the pixel, a bit separation point of separating a priority of the pixel, and the like. Also, the UEP Tx controller 110 may transmit a UEP negotiation request message 120a to a UEP reception controller 210 (hereinafter, referred to as UEP Rx controller), which will be described in detail below, so as to transmit the corresponding video image in the UEP scheme, and receive a UEP response message 120b with respect to the negotiation request message 120a.

Also, the UEP Tx controller 110 may control a series of procedures associated with video image transmission using UEP information 111 and 112 which are negotiated through an exchange between the messages 120a and 120b. Thereafter, the UEP Tx controller 110 may change a bit separation point of pixel element information or a color depth of the pixel element so as to be suitable for a channel state when receiving channel state changed information from the UEP Tx controller 210 of the UEP transmission apparatus 200. Next, the UEP Tx controller 110 may re-negotiate changed information with the UEP Rx controller 210 using a UEP negotiation request message and a UEP negotiation response message.

The bit separator unit 160 may receive, from the video data input interface 101, video data of a series of bit type for each pixel information (R/G/B or Y/Cb/Cr).

The bit separator unit 160 may receive, from the UEP Tx controller 110, the color depth and bit separation point for each pixel information to separate bits. Specifically, the bit separator unit 160 may configure frames each having a high priority or a low priority by separating video data bits inputted for each pixel information in a scheme, which will be described in detail with reference to FIG. 4.

The multiplexing and buffer unit 181 may sequentially multiplex and store the frame with the high priority and the frame with the low priority each being outputted for each pixel information from the bit separator 160, and singly output the multiplexed and stored frames.

The header generation unit 182 may assign a sequence number and a priority (two-level priorities are provided in the present specification, however, depending on embodiments, multi-level priorities may be provided) to the frames outputted from the multiplexing and buffer unit 181, and may receive demodulation information and channel decoding information that is included in modulation and coding scheme (MCS) information 112 required for receiving the frames from the UEP Tx controller 112 to thereby supplement a header.

The channel coding unit 183 may unequally insert channel error correction information depending on a priority of frame data inputted from the header generation unit 182 using channel coding information included in the MCS information 112 provided from the UEP Tx controller 110. Specifically, greater channel error correction information may be inserted in a case of the frame with a high priority, and less channel error correction information may be inserted or no channel error correction information may be inserted in a case of the frame with a low priority.

The symbol mapping and modulation unit 184 may map, in a symbol, bits of the frame outputted from the channel coding unit 183, and modulate the mapped bits according to the channel state and a modulation scheme for each frame priority provided from the UEP Tx controller 110 to transmit the modulated bits to the reception apparatus.

Figure 2:
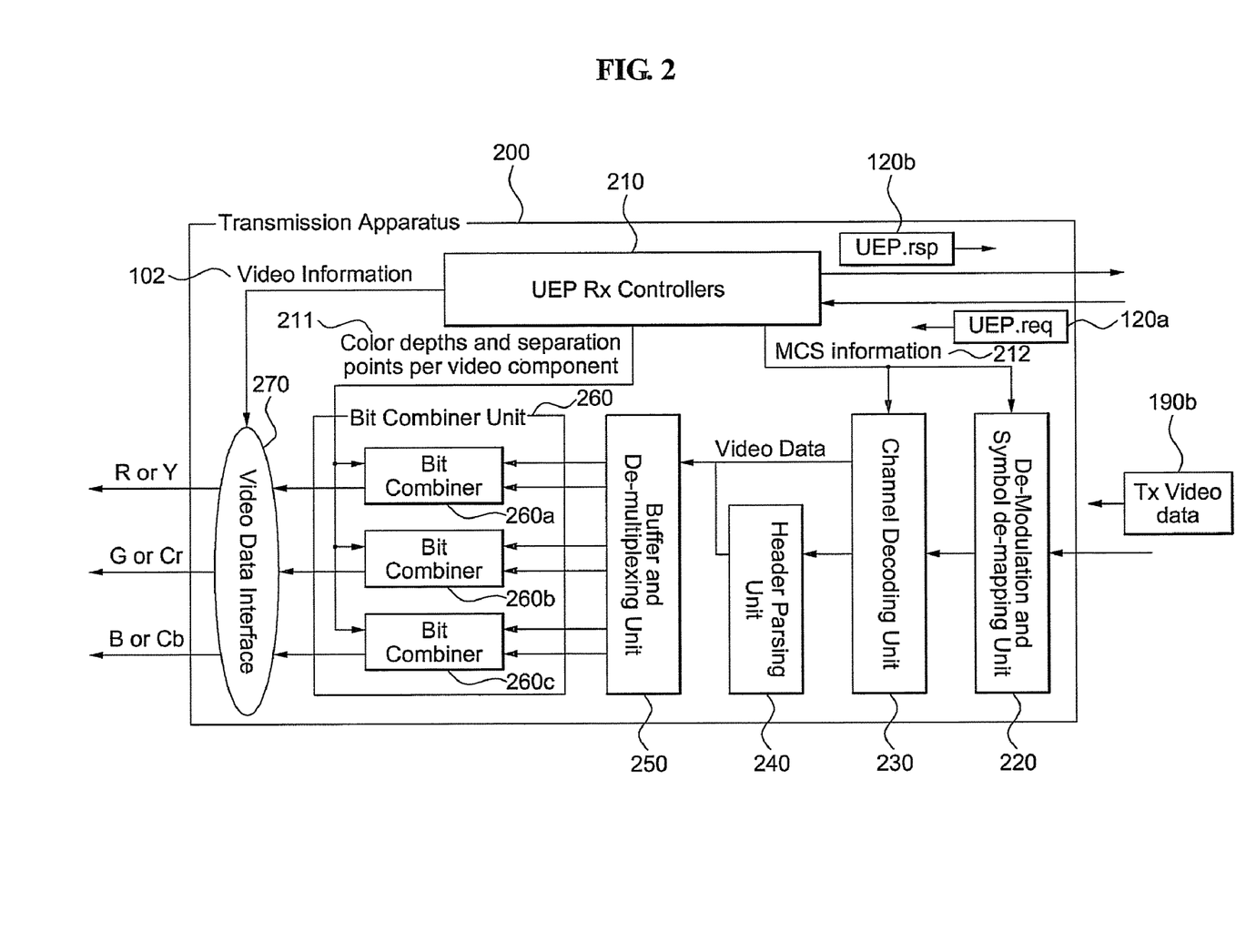
FIG. 2 illustrates a configuration of a UEP reception apparatus based on a dynamic link according to example embodiments.

FIG. 2 illustrates a configuration of a UEP reception apparatus based on a dynamic link according to example embodiments. The UEP reception apparatus 200 may be comprised of component units being identical to those of the UEP transmission apparatus 100, and an operation procedure of UEP reception apparatus 200 may be performed in a reverse order of that of the UEP transmission apparatus 100.

The UEP transmission apparatus 200 includes a demodulation unit to perform a corresponding demodulation based on significance information of UEP video data included in a header of the UEP video data when receiving the UEP video data, a channel decoding unit 230 to perform an error correction coding on the demodulated data separated depending on a priority; and a bit combiner unit 260 to combine the data for each pixel element, on which the error correction coding is performed, through the control of the UEP Rx controller based on the bit field size and the bit separation point. Also, the UEP transmission apparatus 200 may further include a de-modulation and symbol de-mapping unit 220 to modulate received radio frequency (RF) signals and extract bit information from a modulated symbol; a header parsing unit 240 to parse information of a received header and transmit demodulation and channel decoding information of received video data and a priority and sequencing information of the received video data based on the parsed information; a buffer and de-multiplexing unit 250 to store a received video frame and input related frame information to a bit combiner unit 260 depending on the sequencing information and priority information; and a video data output interface 270.

The UEP Rx controller 210 may receive a UEP negotiation request message 120a from the UEP Tx controller 110, and transmit a UEP negotiation response message 120b with respect to the UEP negotiation request message 120a. Also, the UEP Rx controller 210 may control a series of procedures associated with video data reception using UEP information 211 negotiated through an exchange between the messages 120a and 120b.

Next, the UEP Rx controller 210 may generate channel state changed information when the channel state is changed, and transmit the generated information to the UEP Tx controller 110 of the UEP transmission apparatus 100. The UEP Tx controller 110 may receive a changed bit separation point of pixel element information or a changed color depth of the pixel element, each being suitable for the channel state, using the UEP negotiation request message and the UEP negotiation response message, and may re-negotiate with the UEP Rx controller 110.

The de-modulation and symbol de-mapping device 220, the channel decoding unit 230, and the header parsing unit 240 may receive header information according to a predetermined transmitting/receiving scheme of the header information to sequentially process the received header information. The header parsing unit 240 having parsed the header information may transmit, to the de-modulation and symbol de-mapping device 220 and the channel decoding unit 230, demodulation and channel decoding information of video data signals intended to be received. In this instance, a type of the transmitted information may be MCS index information, which will be described in detail below.

The de-modulation and symbol de-mapping device 220 and the channel decoding unit 230 may appropriately process the received video data signals using the demodulation and channel decoding information transmitted from the header parsing unit 240, and transmit the processed signals to the buffer and de-multiplexing unit 250. In this instance, the header parsing unit 240 may also transmit the sequencing information and priority information obtained from corresponding header information to the buffer and de-multiplexing unit 250.

The buffer and de-multiplexing unit 250 may readily extract a frame with a high priority and a frame with a low priority using the sequencing information and priority information inputted together with the video frame data, and input these frames to the bit combiner unit 260.

The bit combiner unit 260 may include a plurality of bit combiners 260a, 260b, and 260c. The bit combiner 260 may receive, from the buffer and de-multiplexing unit 250, the frames with high priority and low priority for each pixel information, and also receive, from the UEP Rx controller 210, the color depth and bit separation point for each pixel information to re-configure original pixel information. The re-configured pixel information may be transmitted to the video data output interface 270.

Figure 3:
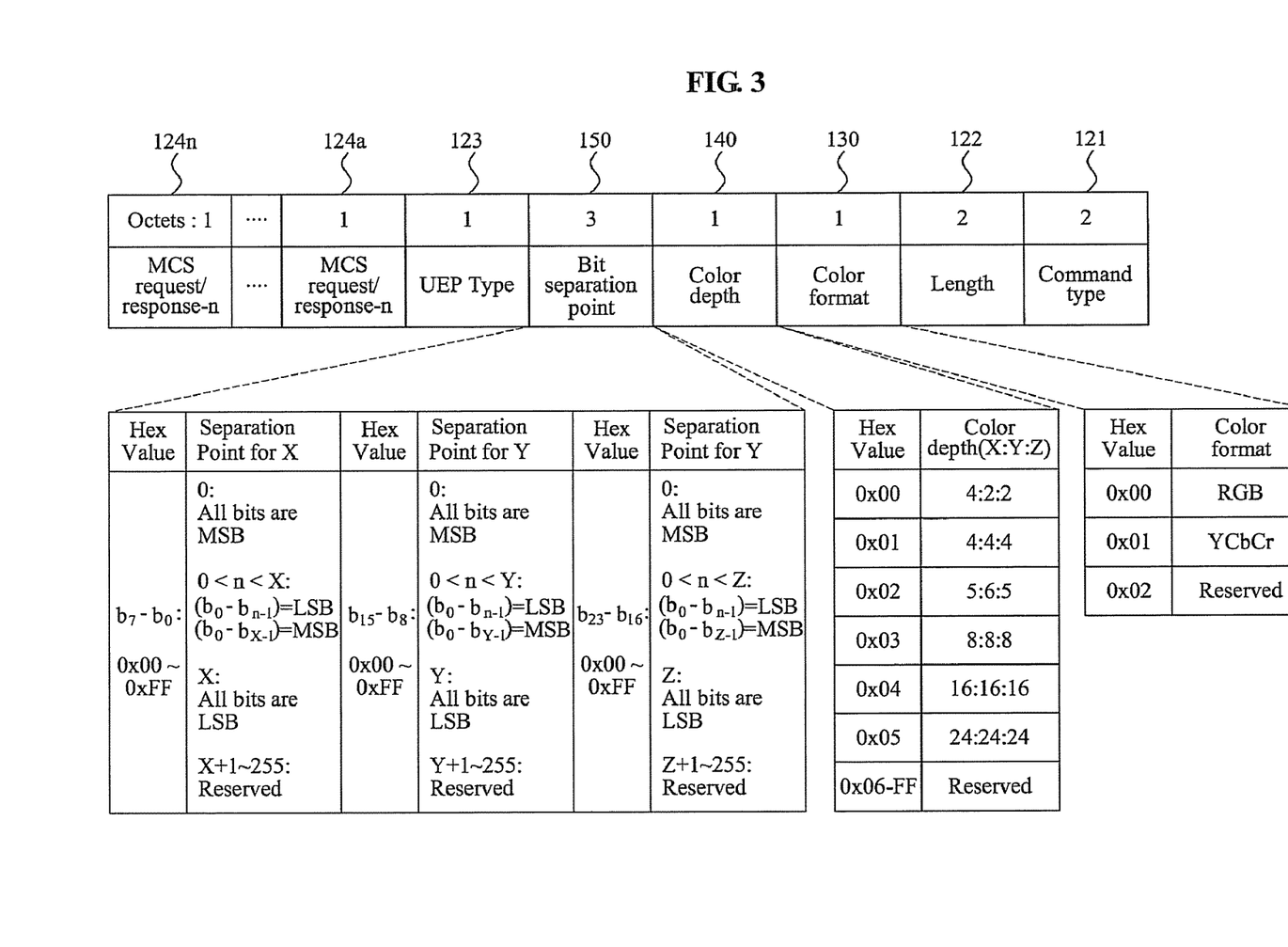
FIG. 3 illustrates a configuration of a UEP negotiation message between a UEP transmission apparatus and a UEP reception apparatus according to example embodiments.

FIG. 3 illustrates a configuration of a UEP negotiation message between a UEP transmission apparatus and a UEP reception apparatus according to example embodiments.

As illustrated in FIG. 3, information required in the present disclosure may be supplemented in a conventional UEP negotiation message.

The UEP negotiation request message 120a transmitted from the UEP Tx controller 110 to the UEP Rx controller 210, and the UEP negotiation response message 120b transmitted from the UEP Rx controller 210 to the UEP Tx controller 110 may have an identical structure as illustrated in FIG. 3.

A command type field 121 may be a field indicating the UEP negotiation request message or the UEP negotiation response message. A length field 122 may be a field indicating a length of the UEP negotiation request message or the UEP negotiation response message. A UEP type field 123 may be a field indicating a UEP type separated in a conventional art, and may not be limited as a predetermined value because the present disclosure is completely compatible with the conventional art.

MCS fields 124a to 124n may be fields indicating MCS types supported for a UEP stream by the UEP Tx controller 110 and UEP Rx controller 210, and may be displayed as a 6-bit (2 bits not being used) index value. In this instance, predetermined MCS-related parameters corresponding to the index value may be assumed to be shared between the MCS fields.

According to the present disclosure, to support various color depths indicating pixel information and support a control of a priority for each pixel information, field information, which will be described below, may be supplemented in a structure of the UEP negotiation message. A color format field 130 describing a color video displaying scheme may be displayed in a 1-byte size, and indicate various color types such as RGB, YCbCr, and the like. Specifically, the color format field 130 may be pixel component information indicating pixel components. A color depth field 140 may indicate a bit-field-size value of three pixel elements.

In FIG. 3, for an illustrative purpose only, 1-byte size may be assigned to the color depth field 140 to display the color depth value of the three pixel elements, however, various methods for displaying the color depth value by assigning the 1-byte size to each of the pixel elements may exist.

A bit separation point field 150 may be supplemented in the structure of the UEP negotiation message, and separate, into bits with a high priority and bits with a low priority, pixel component information being composed of the color depth determined for each pixel element by the color depth field 140.

As an example, as illustrated in FIG. 3, the bit separation point field 150 may be displayed in a 3-byte size (in total, 24 bits of b0 to b23). When each of the color depth values of the three pixel elements in the color depth field 140 are designated as X, Y, and Z, a first byte (b0 to b7) may designate bit point values used when separating pixel elements having a bit field of X into two levels according to a corresponding priority.

A second byte (b8 to b15) may designate bit point values used when separating pixel elements having a bit field of Y into two levels according to a corresponding priority, and a third byte (b16 to b23) may designate bit point values used when separating pixel elements having a bit field of Z into two levels according to a corresponding priority.

Accordingly, when a byte value is designated as '0', all bits of the corresponding pixel elements may be included in a higher priority frame (displayed as a most significant bit (MSB) frame in FIG. 3), and when the byte value is designated as the color depth values (that is, X, Y, and Z), all bits of the corresponding pixel elements may be included in a lower priority frame (displayed as a least significant bit (LSB) frame in FIG. 3).

When the byte value designates an arbitrary n value that is greater than '0' and smaller than the color depth values (that is, X, Y, and Z), all n-bits of 0th bit to a (n−1)-th bit in bits indicating the corresponding pixel elements may be included in the LSB frame, and an n-bit to a (color depth value−1)-th bit may be included in the MSB frame.

As described above, as an example of separately controlling the priority for each pixel element, the bit separation point is designated as 0, 8, and 8, respectively, in a YCbCr system having a color depth value of 8:8:8, whereby all bits used to indicate Y may be included in the MSB frame, and all bits used to indicate the CbCr may be included in the LSB frame. As a result, Y signals that are more sensitive to a sense of sight of a human being may be processed to be immune to channel errors in comparison to CbCr signals that are more insensitive to the sense of sight.

Figure 4:
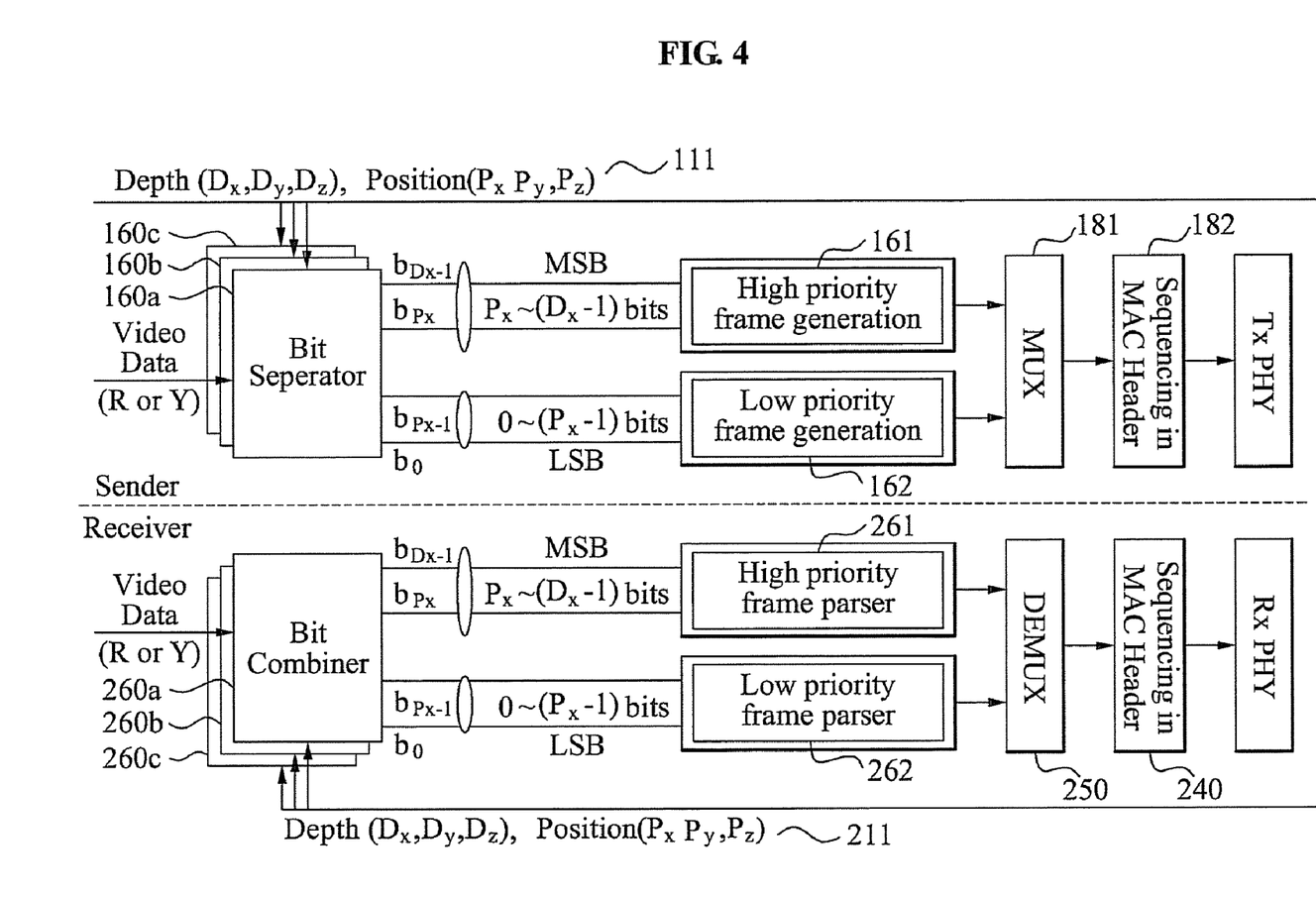
FIG. 4 illustrates a process of a UEP based on a dynamic link according to example embodiments.

FIG. 4 illustrates a process of a UEP based on a dynamic link according to example embodiments. Bit field information (Dx, Dy, and Dz) and bit separation point information (Px, Py, and Pz) for a video pixel element, that are negotiated between the UEP Tx controller 110 and the UEP Rx controller 210 using the UEP negotiation messages 120a and the UEP response message 120b as described with reference to FIG. 3, may be transmitted to the bit separators 160a, 160b, and 160c for each pixel element in a case of the transmission apparatus as shown at 111, and also transmitted to the bit combiners 260a, 260b, and 260c for each pixel element of the bit combiner unit 260 in a case of the reception apparatus as shown at 211.

An example of R or Y pixel elements whose color depth value is Dx, and whose bit separation point value is Px will be herein described in detail. The bit separator 160a of the UEP Tx apparatus 100 may receive, from the video data input interface 101, the R or Y pixel elements in a series of bit types to thereby separate the received pixel elements in a Dx bit unit. Next, the bit separator 160a of the UEP Tx apparatus 100 may enable 0th bit to (Px−1)th bit of the separated Dx bits to be included in the LSB frame 162, that is, the lower priority frame, and also enable Px th bit to (Dx−1)th bit thereof to be included in the MSB frame 161, that is, the higher priority frame.

When frames having a certain size are configured, the MSB frame 161 and the LSB frame 162 may be processed in the procedure as described with reference to FIG. 3, and then the processed frames may be transmitted to the reception apparatus. The UEP Rx controllers 210 may process the received frames in the procedure as described with reference to FIG. 4 to re-configure an MSB frame 261 and LSB frame 262 of R or Y pixel elements, bit information being composed of the MSB frame 261 may be separated in a (Dx-Px) bit unit to be inputted in a bit combiner 260a, and at the same time, bit information being composed of the LSB frame 262 may be separated in a Px bit unit to be inputted in the bit combiner 260a. The bit combiner 260a may combine bits inputted in parallel as described above in a Dx bit unit to re-configure the R or Y pixel elements, and transmit the re-configured R or Y pixel elements to the data output interface 270.

Figure 5:
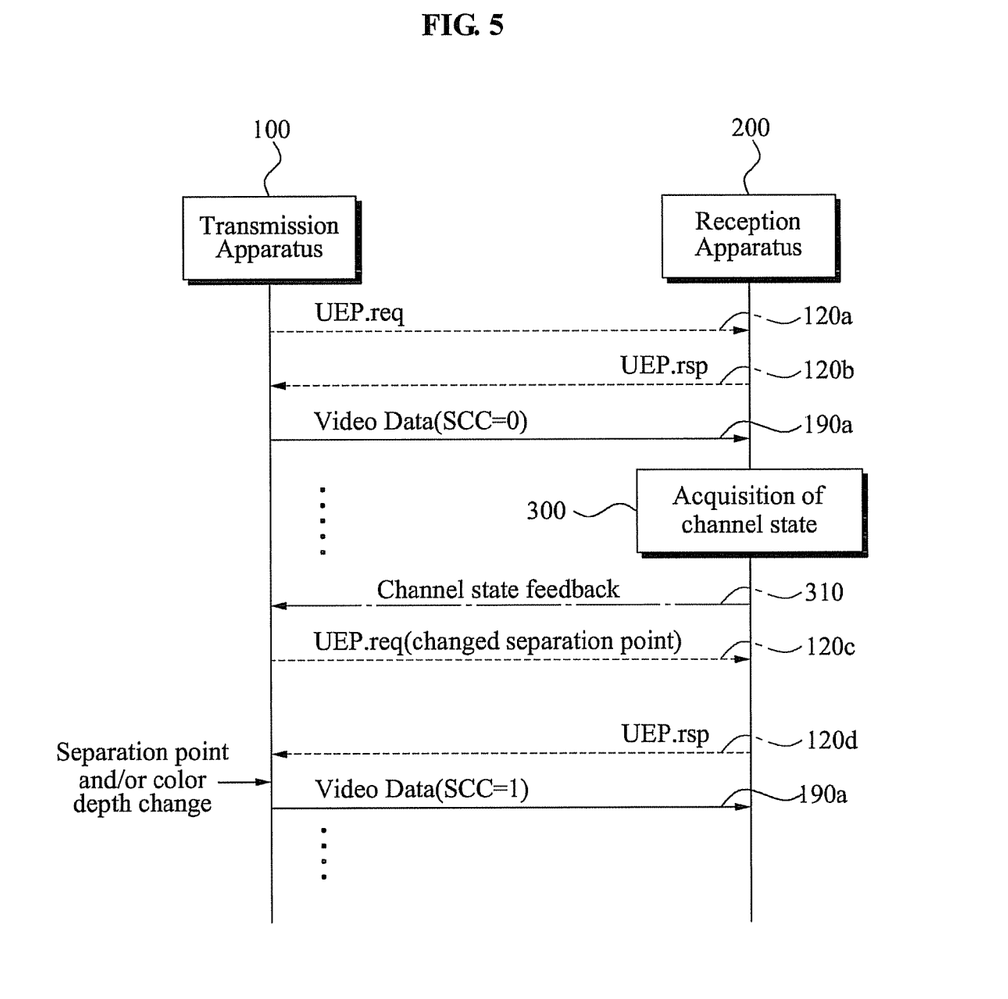
FIG. 5 illustrates a process of adaptively changing a bit separation point for determining a significance of pixel element information based on a variable radio channel state of a dynamic link according to example embodiments.

FIG. 5 illustrates a process of adaptively changing a bit separation point for determining a significance of pixel element information based on a variable radio channel state of a dynamic link according to example embodiments.

To transmit video data through the UEP, the UEP transmission apparatus 100 and the UEP reception apparatus 200 may negotiate pixel information of the video data (color format field 130, the color depth field 140 of the pixel element, the bit separation point field 150, and the MCS fields 124a to 124n) using the UEP negotiation request message 120a and the UEP negotiation response message 120b. Next, the UEP transmission apparatus 100 may transmit video data 190a using negotiated parameter values. The UEP reception apparatus 200 may acquire state information of a radio channel while processing received video data 190b as shown in operation 300. The UEP Rx controller 210 of the UEP reception apparatus 200 may inform the UEP Tx controller 110 of the UEP transmission apparatus 100 of the state information of the radio channel using various methods. The UEP Rx controller 210 may periodically transmit the state information of the radio channel through a reception response message of the video data as a method of informing of channel state changed information 310. Also, the UEP Rx controller 210 may inform the UEP Tx controller 110 of the channel state changed information 310 when the radio channel state exceeds a predetermined threshold, as illustrated in FIG. 5. The UEP Rx controller 110 may change the bit separation point field 150 of pixel element information or the color depth field 140 so as to be suitable for the channel state. Next, the UEP Tx controller 110 may re-negotiate with the UEP Rx controller 210 using a changed UEP negotiation request message 120c and a changed UEP negotiation response message 120d. When the re-negotiation is completed, the UEP Tx controller 110 may transmit the video data through changed parameters.

Figure 7:
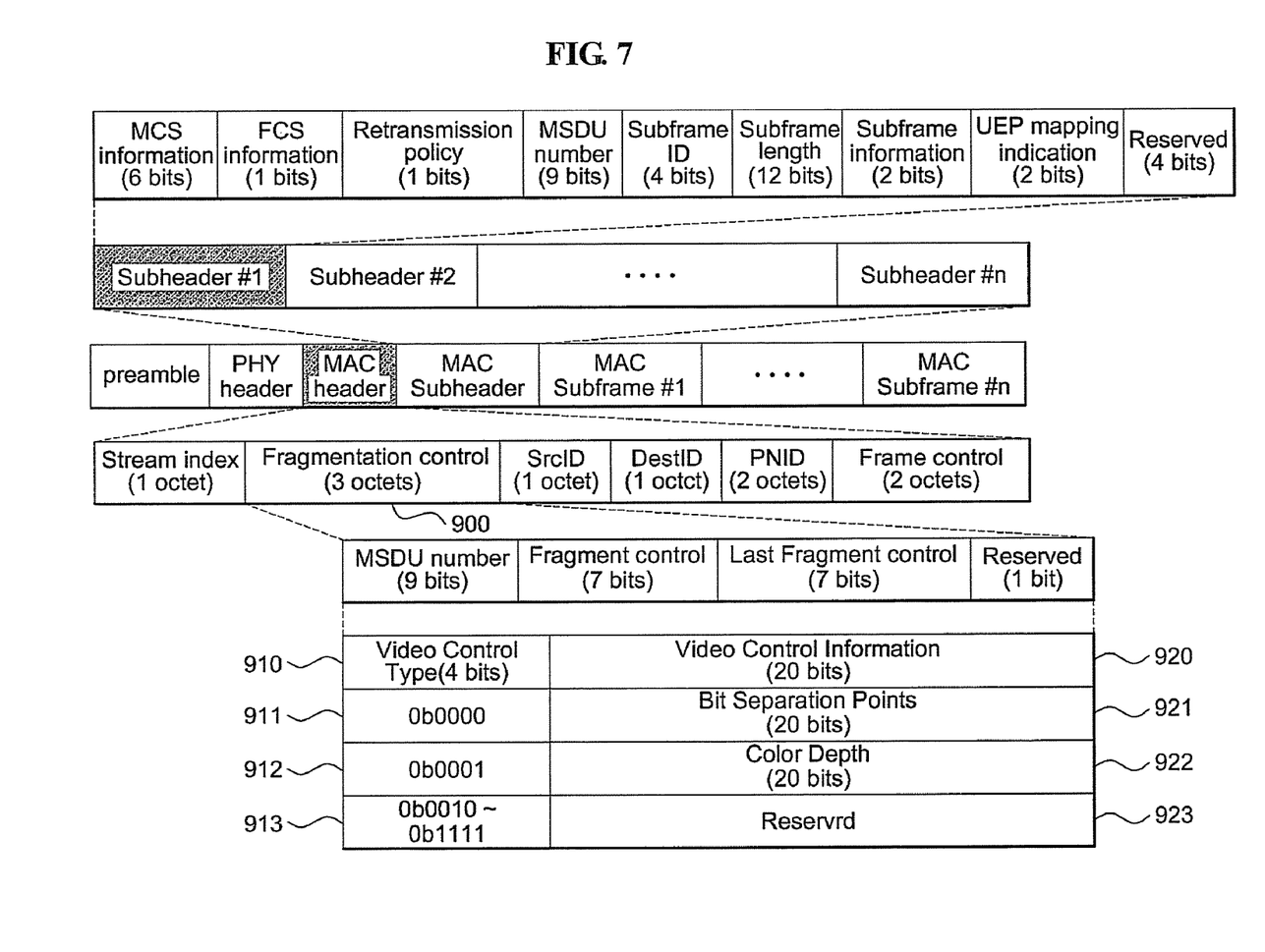
FIG. 7 illustrates a configuration of UEP video data based on a dynamic link in a 60 GHz wireless network system according to example embodiments.

In this instance, the UEP transmission apparatus 100 may consecutively transmit the video data using existing negotiated parameters until the re-negotiation is completed, and may suggest a structure of the video data as illustrated in FIG. 7 to easily recognize a parameter change in the UEP reception apparatus 200.

Figure 6:
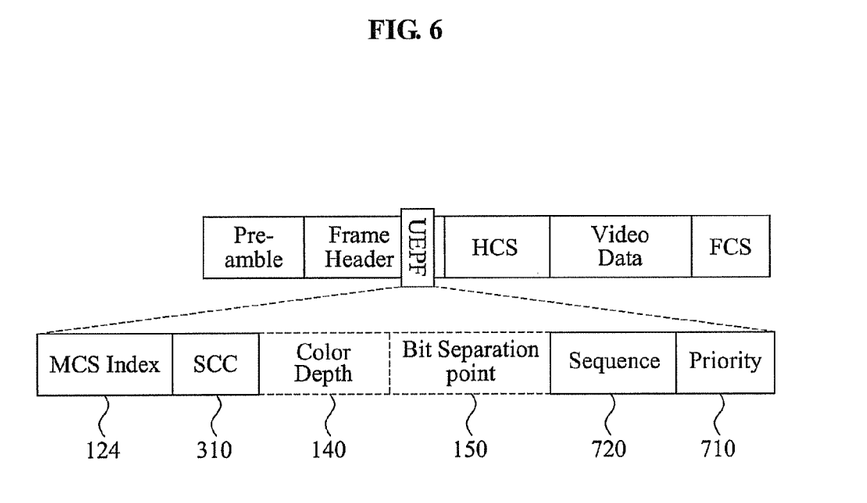
FIG. 6 illustrates a configuration of UEP video data based on a dynamic link according to example embodiments.

FIG. 6 illustrates a configuration of UEP video data based on a dynamic link according to example embodiments. In FIG. 6, a structure of UEP video data 190a and 190b transmitted to the UEP reception apparatus 200 by the UEP transmission apparatus 100 is illustrated.

In general, UEP information may be transmitted in a frame header type, and include a priority field 710 indicating a priority of transmitted video data, a sequence number field 720 indicating a transmission order, and an MCS field 124 indicating a modulation and a channel coding scheme of video data.

In particular, according to the present example embodiment, other implemented examples of the present disclosure may be suggested, in which the color depth field 140 and bit separation point field 150 of the pixel may be transmitted through the UEP negotiation message as described with reference to FIG. 1 to FIG. 5, corresponding information may be transmitted together with video data as described with reference to FIG. 7 below, and the UEP reception apparatus 200 may restore original pixel information using frame header information. Also, to display a dynamic change in the color depth field 140 and the bit separation point field 150, supplementing a bit Separation point and/or color depth Change Count (SCC) field 320 may be suggested. The UEP Tx controller 110 of the UEP transmission apparatus 100 may increase the SCC field value by an increment of '1' starting from '0' when a change in the pixel information is generated. The UEP Rx controller 210 of the UEP reception apparatus 200 may recognize changed pixel information through a change in the SCC field, and restore original pixel information using the changed parameter values.

FIG. 7 illustrates a configuration of UEP video data based on a dynamic link in a 60 GHz wireless network system according to example embodiments.

The 60 GHz wireless network system may be a system of providing a transmission rate of several giga-bits per second using a 60 GHz frequency band. As illustrated in FIG. 7, a fragmentation control field 900 of an MAC header may be unused due to an overlap with a field defined in the MAC sub-header. According to the present example embodiment, the unused fragmentation control field 900 of the MAC header may be used for controlling the video data information.

As illustrated in FIG. 7, the fragmentation control field 900 of the MAC header may be separated into a video control type field 910 and a video control information field 920. According to the present disclosure, when a value of the video control type field 910 is 0b0000 (911), the video control information field 920 may be used as bit separation points information 921, and the bit separation points information 921 may be used by adjusting a number of bits for each pixel of the bit separation point field 150 as described with reference to FIG. 3. Also, according to the present example embodiment, when the value of the video control type field 910 is 0b0001, the video control information field 920 may be used as color depth information 922, and the color depth information 922 may use the color depth field 140 described with reference to FIG. 3. In particular, when a data rate provided by a system may not support a video data occurrence rate due to a significantly poor channel state, the value of the video control type field 912 and the color depth information 922 may dynamically reduce a value of the color depth, and inform the reception apparatus of the reduced value. In addition, control information required in transmission of the video data may be defined as predetermined values 913 and 923 of the video control type field 910 and video control information field 920.

Figure 8:
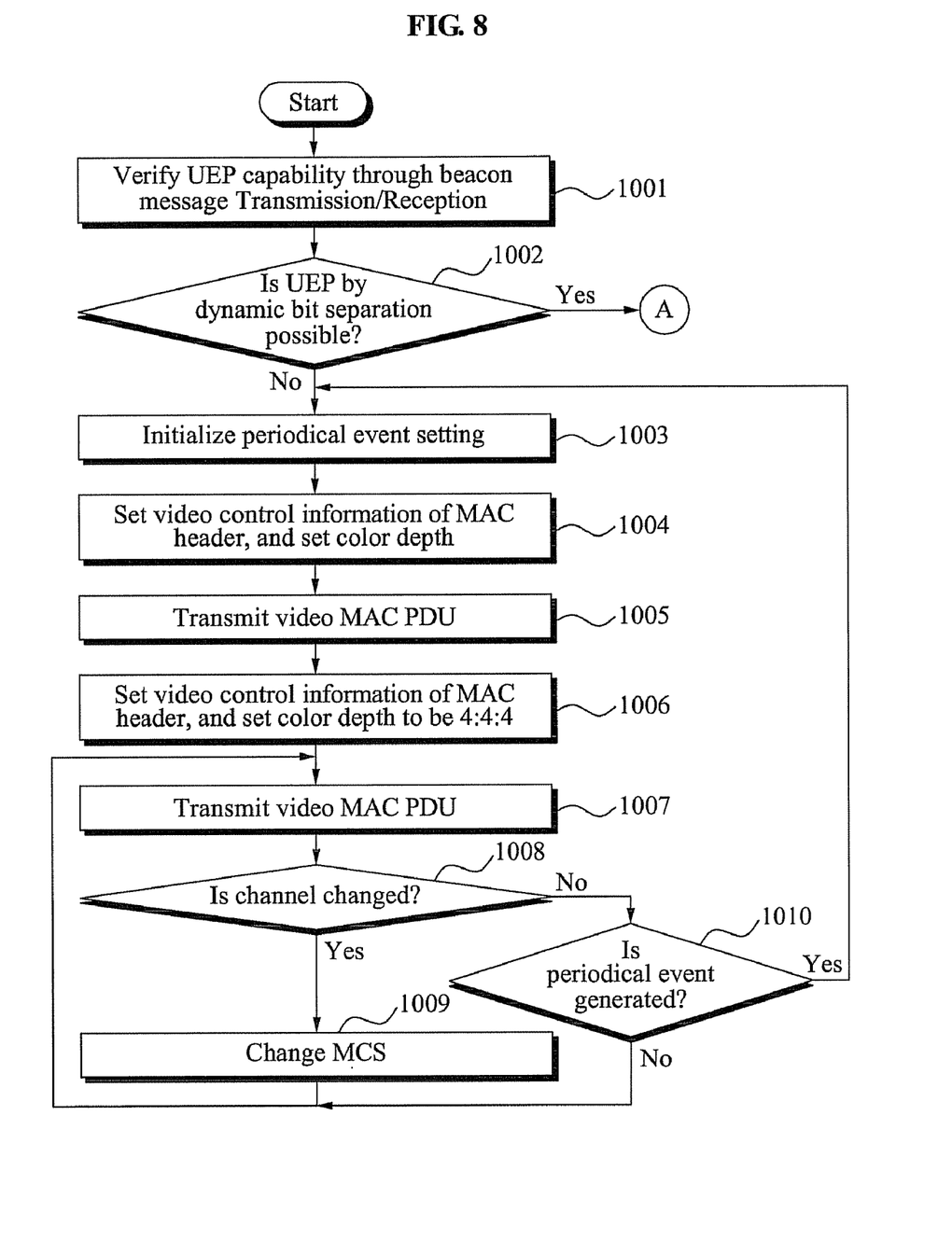
FIG. 8 is a flowchart illustrating a process of a case where a UEP is impossible in a UEP transmission apparatus based on a dynamic link according to example embodiments.
Figure 9:
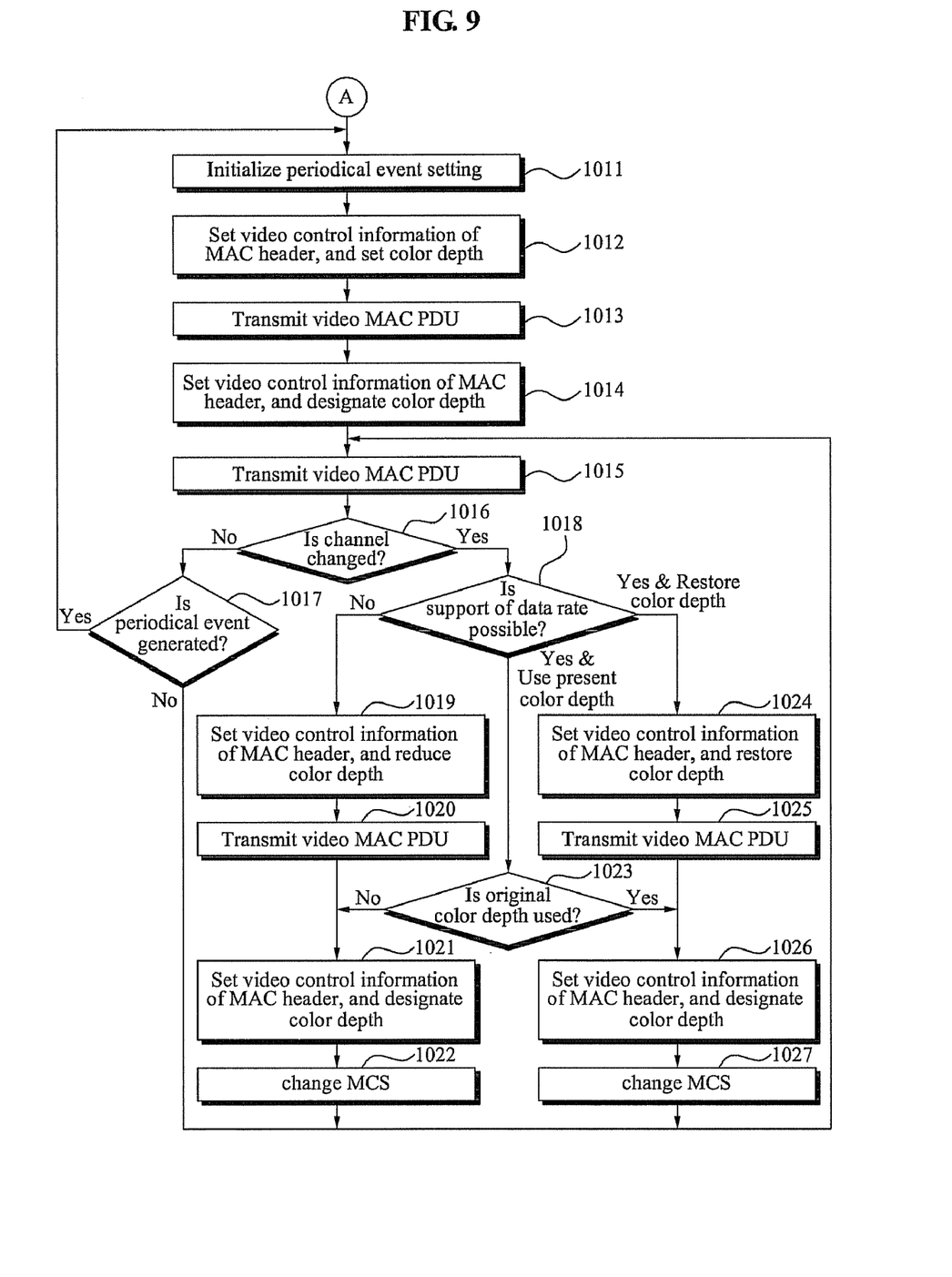
FIG. 9 is a flowchart illustrating a process of a case where a UEP is possible in a UEP transmission apparatus based on a dynamic link according to example embodiments.

FIGS. 8 and 9 illustrate a flowchart considering a dynamic link through the MAC header in which the present disclosure is applied, in the 60 GHz wireless network system. The flowchart illustrates a procedure of being dynamically adapted in a radio channel link using the MAC header of FIG. 7 in a transmission apparatus of the 60 GHz wireless network system according to the example embodiment, and more specifically, illustrates an example embodiment of a method utilizing the video control type field 910 and the video control information field 920 suggested in FIG. 7.

FIG. 8 is a flowchart illustrating a process of a case where a UEP is impossible in a UEP transmission apparatus based on a dynamic link according to example embodiments.

Referring to FIG. 8, in operation 1001, the UEP transmission apparatus according to the present example embodiment may verify UEP capability information with respect to processing of video data transmission/reception of each apparatus through the UEP reception apparatus and a beacon message before the video data is transmitted.

In operation 1002, the UEP transmission apparatus may verify whether an UEP due to dynamic bit separation is possible. A case where the UEP is possible will be described in detail with reference to FIG. 9. A process of verifying whether the UEP due to the dynamic bit separation using the beacon message is possible will be described in detail with reference to FIG. 10.

In operation 1002, when the UEP is impossible by the UEP reception apparatus, the UEP transmission apparatus may advance to operation 1003 to perform a periodic event setting initialization so as to periodically transmit the MAC header having the video control type field 910 and the video control information field 920. In this instance, the periodic event setting initialization may create an event when a timer expires, create the event after transmitting a certain number of MAC PDUs, or create the event through various other methods.

In operation 1004, the UEP transmission apparatus may designate a color depth value for each pixel of the video data as video control information of the MAC header. In operation 1005, the UEP transmission apparatus may transmit generated MAC PDU. In operation 1006, when transmitting an initial MAC PDU, the UEP transmission apparatus may designate MAC header video control information to enable a bit separation point value (for example, R:G:B) for each pixel of the video data to be 4:4:4 of a basic value. In operation 1007, the UEP transmission apparatus may transmit the generated MAC PDU.

In operation 1008, the UEP transmission apparatus may receive channel state changed information from the UEP reception apparatus to verify whether the channel state is changed. In operation 1009, when the channel state is changed and a change in the MCS is needed based on a result of operation 1008, the UEP transmission apparatus may change the MCS into a new MCS being suitable for the channel state, return to operation 1007, display the changed MCS in the MAC sub-header, and transmit the MAC PDU. In operation 1010, when the channel state is not changed based on the result of operation 1008, the UEP transmission apparatus may verify whether the periodic event designated in operation 1003 is created. When the periodic event is not still created based on a result of operation 1010, the UEP transmission apparatus may return to operation 1007, and consecutively transmit the generated MAC PDU. In this instance, values of the video control type field 910 and video control information field 920 of the MAC header may be preceding MAC PDU header values or predetermined values 913 and 923, that is, meaningless values When the periodic event is created based on the result of operation 1010, the UEP transmission apparatus may return to operation 1003, re-perform a series of procedures of 1003 to 1007 to periodically signalize the video control type field 910 and video control information field 920 of the MAC header.

FIG. 9 is a flowchart illustrating a process of a case where a UEP is possible in a UEP transmission apparatus based on a dynamic link according to example embodiments.

When the UEP due to the bit separation is possible base on a result of operation 1002 of FIG. 8, the UEP transmission apparatus may advance to operation 1011, and perform the periodic event setting initialization so as to periodically transmit the MAC header having the video control type field 910 and the video control information field 920 defined in FIG. 7. In this instance, the periodic event setting initialization may create an event when a timer is terminated, create the event after transmitting a certain number of MAC PDUs, or create the event through various methods.

Next, in operation 1012, the UEP transmission apparatus may designate the color depth value for each pixel of the video data as the video control information of the MAC header. Next, in operation 1013, the UEP transmission apparatus may transmit the generated MAC PDU. In operation 1014, when an initial MAC PDU is transmitted, the UEP transmission apparatus may designate the MAC header video control information to enable the bit separation point value (for example R:G:B) for each pixel of the video data to be 4:4:4 of a basic value.

Next, in operation 1016, the UEP transmission apparatus may receive the channel state changed information from the UEP reception apparatus, and verify whether the channel state is changed. When the channel state is not changed based on a result of operation 1016, the UEP transmission apparatus may advance to operation 1017 to verify whether the periodic event designated in operation 1011 is created. When the periodic event is not still created based on a result of operation 1017, the UEP transmission apparatus may return to operation 1015 to consecutively transmit the generated MAC PDU. In this instance, values of the video control type field 910 and video control information field 920 of the MAC header may be preceding MAC PDU header values or predetermined values 913 and 923, that is, meaningless values When the periodic event is created based on the result of operation 1017, the UEP transmission apparatus may return to operation 1011, and re-perform a series of procedures of 1011 to 1015 to periodically signalize the video control type field 910 and the video control information field 920 of the MAC header. When a newly defined video control type field 910 and video control information field 920 are used as necessary, a corresponding periodic event is set to periodically signalize a corresponding video control type field 910 and video control information field 920 when a corresponding periodic event is created.

When the channel state is changed based on the result of operation 1016, the UEP transmission apparatus may advance to operation 1018 to verify whether to support an occurrence rate of the video data through a MCS being suitable for the channel state.

When a transmission rate of a system does not support the occurrence rate of the video data due to a poor channel state based on a result of operation 1018, the UEP transmission apparatus may advance to operation 1019, and eliminate certain lower bits having a lower significance from pixel bit information corresponding to the color depth for each pixel introduced from an MAC upper hierarchy to configure a payload of the MAC PDU, thereby reducing an amount of data to be transmitted. To inform the UEP reception apparatus of this, a value of the video control type field 910 may be designated as 0b0001 (912), and a value of the video control information field 920 may be designated as reduced color depth information 922.

Next, in operation 1020, the UEP transmission apparatus may transmit an initial MAC PDU that is encapsulated into the MAC header including the reduced color depth information 922.

Next, in operation 1021, the UEP transmission apparatus may configure the MAC header in which the bit separation point value being suitable for the channel state is designated as the values of the video control information field 920 and the video control type field 910. Also, the UEP transmission apparatus may advance to operation 1022 to change the MCS, and advance to operation 1015 to configure and transmit the MAC PDU.

When the reduced color depth is able to be restored due to an improved channel state based on a result of operation 1018, the UEP transmission apparatus may advance to operation 1024, and restore the certain lower bits eliminated from the MAC hierarchy to configure a payload of the MAC PDU, thereby restoring the amount of the data to be transmitted into an original amount thereof. To inform the UEP reception apparatus of this, the value of the video control type field 910 may be designated as 0b0001 (912), and the value of the video control information field 920 may be designated as the originally restored color depth information 922. Next, the UEP transmission apparatus may advance to operation 1025 to transmit the MAC PDU that is encapsulated into the MAC header including the restored color depth information 922. Next, the UEP transmission apparatus may advance to operation 1026 to configure the MAC header in which the bit separation point value being suitable for the channel state is designated as the values of the video control information field 920 and the video control type field 910. Also, as necessary, the UEP transmission apparatus may advance to operation 1027 to change the MCS, and advance to operation 1015 to configure and transmit the MAC PDU.

When an amount of the video data generated as a currently used color depth of a pixel is supported in the changed channel state even though the channel state is changed based on the result of operation 1018, the UEP transmission apparatus may advance to operation 1023 to verify whether an original color depth not being reduced is used.

When the currently used color depth of the pixel is the reduced color depth based on a result of operation 1023, the UEP transmission apparatus may advance to operation 1021 to perform a series of the following procedures.

However, when the currently used color depth is the color depth not being reduced based on the result of operation 1023, the UEP transmission apparatus may advance to operation 1026 to perform a series of following procedures.

Specifically, the UEP transmission apparatus may configure the MAC header using a bit separation point value being suitable for the changed change state without a change in the color depth, through operations 1021 to 1026. The UEP transmission apparatus may change the MCS through operations 1021 to 1026, as necessary, and return to operation 1015 to configure and transmit the MAC PDU.

Figure 10:
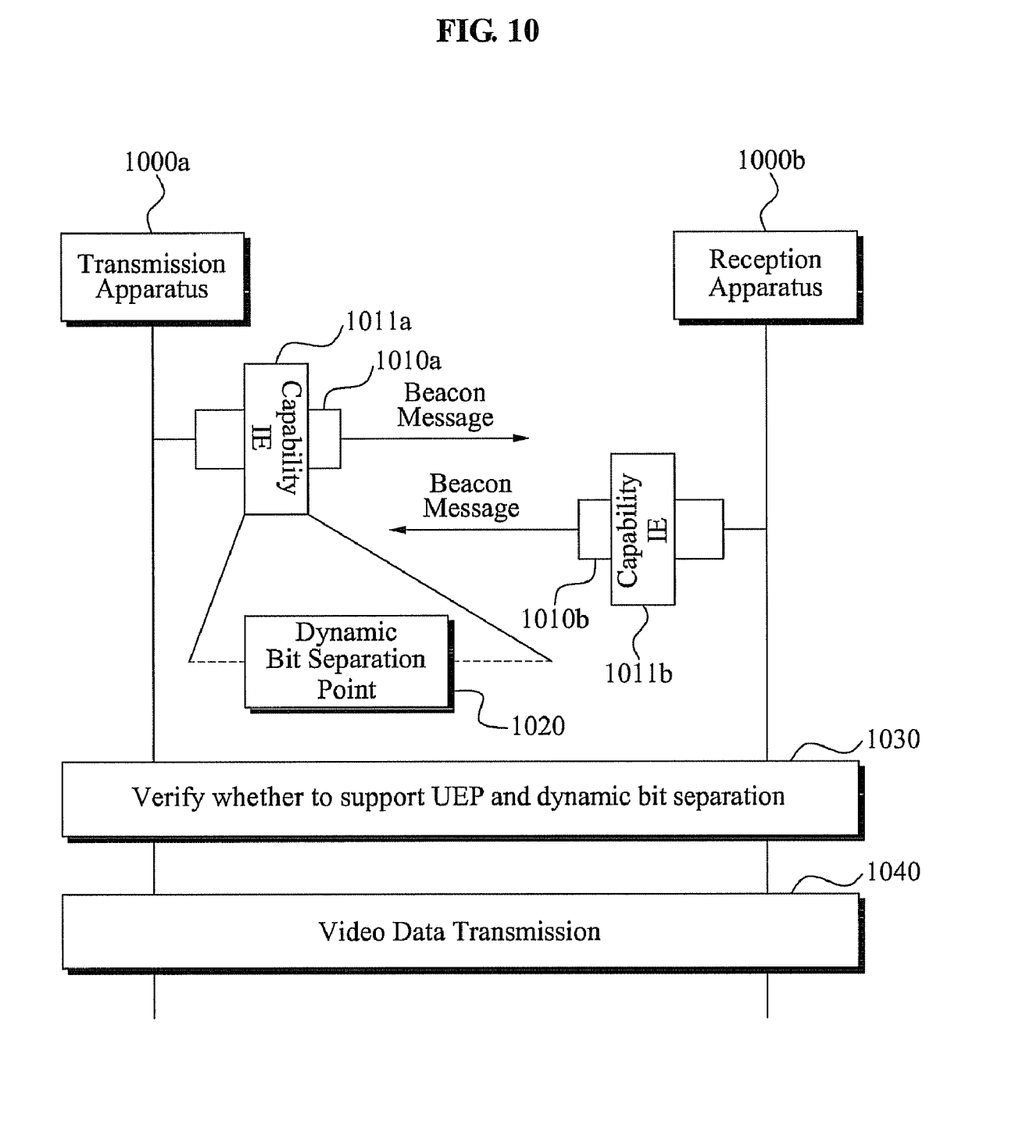
FIG. 10 illustrates a process of verifying a beacon message structure used for expressing a UEP capability in accordance with dynamic bit-separation, and for expressing the UEP capability through the beacon message in a broadband high frequency wireless system according to example embodiments.

FIG. 10 illustrates a process verifying a beacon message structure used for expressing a UEP capability in accordance with dynamic bit-separation, and for expressing the UEP capability through the beacon message in a broadband high frequency wireless system according to example embodiments.

The beacon message may be messages 1010*a* and 1010*b* that are periodically transmitted by transmission/reception apparatuses 1000*a* and 1000*b* configuring the 60 GHz wireless network system before data communication, and may include UEP capability information 1011*a* and 1011*b*. According to the present example embodiment, including a dynamic bit separation point field 1020 in the UEP capability information 1011*a* and 1011*b* of the beacon message may be suggested.

In operation 1030, the transmission/reception apparatuses 1000*a* and 1000*b* may display and verify whether to support a conventional UEP and whether to support a dynamic bit separation point using the dynamic bit separation point field 1020. The transmission/reception apparatuses 1000*a* and 1000*b* having verified whether to support the UEP and dynamic bit separation point using the beacon message may perform transmission/reception of the video data being suitable for a corresponding UEP capability information in operation 1040. The dynamic bit separation point field 1020 included in the UEP capability information 1011*a* and 1011*b* of the beacon message may be the same as the bit separation point bit 150 included in the UEP negotiation message of FIG. 3, and may be configured with bits displaying whether to support the dynamic bit separation point under an assumption in which the signalization is possible as illustrated in FIG. 7.

Figure 11:
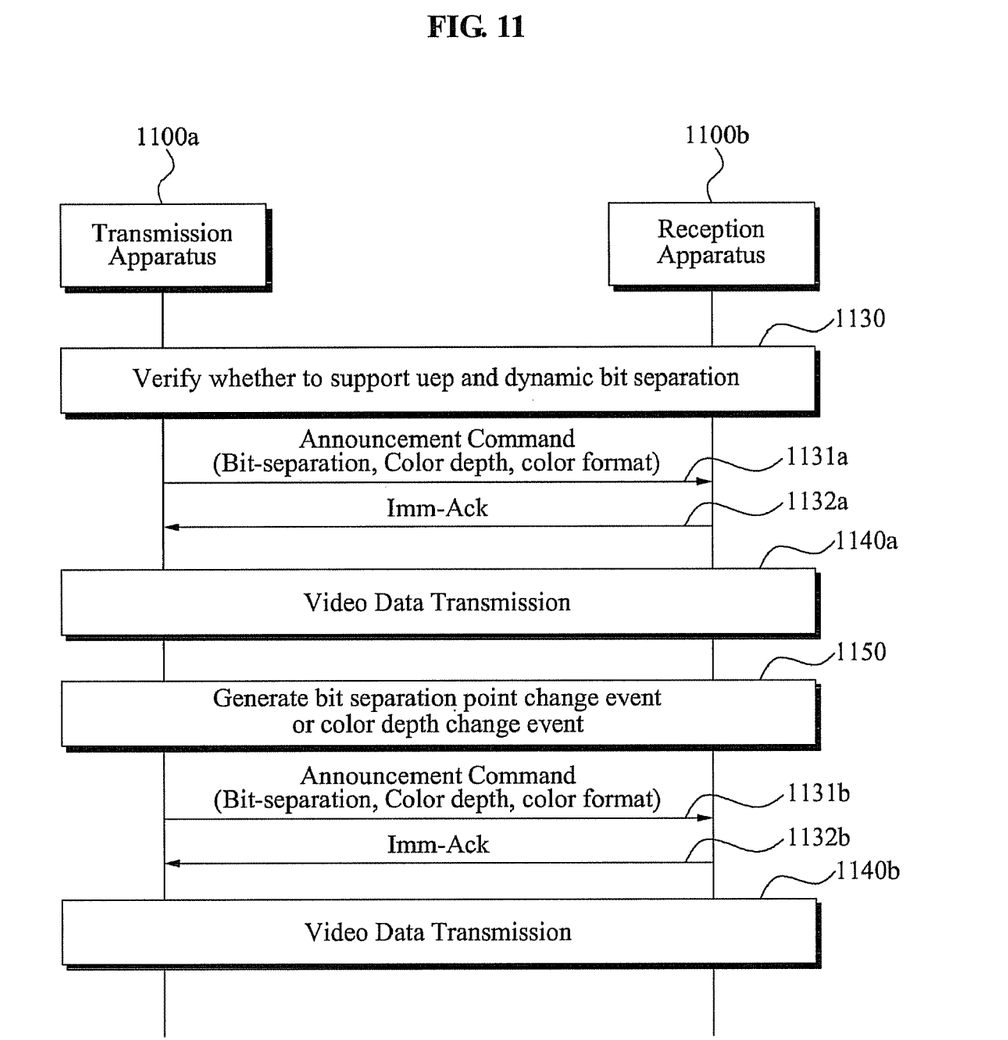
FIG. 11 illustrates a process of informing of variations of a bit separation point or color depth using announcement messages in a broadband high frequency wireless system according to example embodiments.

FIG. 11 illustrates a process of informing of variations of a bit separation point or color depth using announcement messages in a broadband high frequency wireless system according to example embodiments.

A method of dynamically changing the bit separation point and color depth using announcement messages 1131*a* and 1131*b* in the 60 GHz wireless network system of the broadband high frequency wireless system is illustrated in FIG. 11. As illustrated in FIG. 10, in operation S1130, a UEP capability may be verified between a transmission apparatus 1100*a* and a reception apparatus 1100*b*. When supporting of UEP and dynamic bit separation is possible based on a verified result of the UEP capability, the transmission apparatus 1100*a* may transmit, to the reception apparatus 1100*b*, information about the bit separation point and color depth associated with a configuration of video data using the announcement message 1131*a* before transmitting the video data. Also, the transmission apparatus 1100*a* may receive, from the reception apparatus 1100*b*, a reception verification 1132*a* with respect to the transmitted information of the transmission apparatus 1100*a*. The transmission apparatus 1100*a* may verify that the transmitted information is successfully transmitted through the reception verification 1132*a*, and start to transmit the video data in operation S1140*a*. In operation 1150, the bit separation point or color depth may be required to be changed due to the variation of the channel state while transmitting the video data. In this case, the transmission apparatus 1100*a* may transmit, to the reception apparatus 1100*b*, changed bit separation point information and changed color depth information using the announcement message 1131*b*, and may receive a reception verification 1132*b* with respect to the transmitted information of the transmission apparatus 1100*a*.

As described above, according to the present disclosure, there are provided a UEP apparatus and method of the present disclosure, that may more strongly protect more important pixel information, and adaptively cope with a variable change state, thereby preventing significant deterioration of image quality occurring in transmission channel errors in a reception end. Also, an error control may be focused on more important signal elements, thereby improving a transmission speed.

The UEP method according to the above-described example embodiments may be recorded in computer-readable media including program instructions to implement various operations embodied by a computer. The media may also include, alone or in combination with the program instructions, data files, data structures, and the like. Examples of computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described example embodiments, or vice versa.

Although a few example embodiments have been shown and described, the present disclosure is not limited to the described example embodiments. Instead, it would be appreciated by those skilled in the art that changes may be made to these example embodiments without departing from the principles and spirit of the disclosure, the scope of which is defined by the claims and their equivalents.

What is claimed is:

1. An Unequal Error Protection (UEP) method based on a dynamic link in a transmission apparatus, the UEP method comprising:
    verifying, using a UEP transmission controller, based on a channel state when video data is inputted, a bit separation point for separating a bit field size and a priority for each pixel element being comprised of a pixel of the video data;
    separating the pixel of the video data based on the priority for each pixel element;
    performing an error correction coding for correcting relatively many errors occurring in information with a high priority for each pixel element; and
    changing the bit field size and the bit separation point based on channel state changed information when receiving the channel state changed information from the dynamic link in the transmission apparatus.

2. The UEP method of claim 1, wherein the verifying transmits/receives a UEP negotiation message including UEP reception apparatus information, pixel element information, bit field size information, and bit separation point information to thereby negotiate the bit field size and the bit separation point for each pixel element.

3. The UEP method of claim 1, wherein the changing transmits/receives a UEP negotiation message including UEP reception apparatus information, information about the changed bit field size, and information about the changed bit separation point to thereby negotiate the changed bit field size and the changed bit separation point according to the pixel element.

4. The UEP method of claim 1, further comprising:
separating bits for each priority, on which the error correction coding is performed based on the priority and channel state, to generate a frame, and modulating the frame using a predetermined modulation scheme corresponding to the priority to thereby generate UEP video data.

5. The UEP method of claim 4, wherein the UEP video data includes priority information indicating a priority of the UEP video data, sequence number information indicating a transmission order, modulation and coding scheme (MCS) index information indicating a modulation and channel coding scheme of the UEP video data, pixel element information, and bit field size information.

6. The UEP method of claim 4, wherein the UEP video data includes a media access control (MAC) header, and a fragmentation control field of the MAC header includes a video control type field and a video control information field.

7. The UEP method of claim 6, wherein the UEP video data uses the video control type field for defining a type of the video control information field, and also uses the video control information field for information indicating the bit field size or the bit separation point.

8. A UEP method based on a dynamic link in a reception apparatus, the UEP method comprising:
transmitting channel state changed information according to a channel state from the dynamic link in the reception apparatus, and verifying, using a UEP transmission controller, a bit separation point for separating a bit field size and a priority for each pixel element being comprised of a pixel of video data;
demodulating UEP video data according to priority information of UEP video data included in a header of the UEP video data, when receiving the UEP video data;
correcting data in accordance with an error correction coding obtained by separating the demodulated data according to the priority information;
combining the corrected data for each pixel element based on the bit field size and the bit separation point; and
transmitting/receiving a UEP negotiation message including modified bit field size information and modified bit separation point information of a UEP transmission apparatus to thereby negotiate the modified bit field size information and the modified bit separation point in accordance with the pixel element.

9. The UEP method of claim 8, wherein the transmitting transmits/receives a UEP negotiation message including UEP transmission apparatus information, pixel element information, the bit field size information, and the bit separation point information to thereby negotiate the bit field size and bit separation point according to the pixel element.

10. The UEP method of claim 8, wherein the UEP video data includes priority information indicating a priority of the UEP video data, sequence number information indicating a transmission order, modulation and coding scheme (MCS) index information indicating a modulation and channel coding scheme of the UEP video data, pixel element information, bit field size information, and change count information indicating a number of changes in the bit field size and the bit separation point in accordance with a change of the channel state.

11. The UEP method of claim 8, wherein the UEP video data includes a MAC header, and a fragmentation control field of the MAC header includes a video control type field and a video control information field.

12. The UEP method of claim 11, wherein the UEP video data uses the video control type field for defining a type of the video control information field, and also uses the video control information field for information indicating the bit field size or the bit separation point.

13. A UEP transmission apparatus based on a dynamic link, the UEP transmission apparatus comprising:
a UEP transmission controller to verify, based on a channel state when video data is inputted, a bit field size and a bit separation point of separating a priority for each pixel element being comprised of a pixel of the video data, and to control an error correction coding for correcting relatively many errors occurring in information with a high priority for each pixel element to be used;
a bit separator unit to separate the video data pixel based on the priority for each pixel element; and
a channel coding unit to perform a corresponding error correction coding through the control of the UEP transmission controller based on the priority for each pixel element,
wherein the UEP transmission controller changes the bit field size and the bit separation point based on channel state changed information when receiving the channel state changed information.

14. The UEP transmission apparatus of claim 13, wherein the UEP transmission controller transmits/receives a UEP negotiation message including UEP reception apparatus information, pixel element information, bit field size information, and bit separation point information to thereby negotiate the bit field size and the bit separation point for each pixel element.

15. The UEP transmission apparatus of claim 13, wherein the UEP transmission controller transmits/receives a UEP negotiation message including UEP reception apparatus information, information about the changed bit field size, and information about the changed bit separation point to thereby negotiate the changed bit field size and the changed bit separation point according to the pixel element.

16. The UEP transmission apparatus of claim 13, further comprising:
a modulation unit to output UEP video data generated by modulating a frame using a predetermined modulation scheme, the frame being configured for each bit separated in accordance with the channel state and the priority in which the error correction coding is performed in the channel coding unit.

17. The UEP transmission apparatus of claim 16, wherein the UEP video data includes priority information indicating a priority of the UEP video data, sequence number information indicating a transmission order, modulation and coding scheme (MCS) index information indicating a modulation and a channel coding scheme of the UEP video data, pixel element information, bit field size information, and change count information indicating a number of changes in the bit field size and bit separation point in accordance to a change of the channel state.

* * * * *